United States Patent [19]

Ho

[11] Patent Number: 6,147,920
[45] Date of Patent: Nov. 14, 2000

[54] NOISE EQUALIZED DAC AND DEVICE CAPABLE OF EQUALIZING NOISE IN SRAM

[75] Inventor: Yung-Yuan Ho, Hsinchu Hsien, Taiwan

[73] Assignee: Industrial Technology Research Institute, Hsinchu, Taiwan

[21] Appl. No.: 09/081,865

[22] Filed: May 21, 1998

[30] Foreign Application Priority Data

Jul. 1, 1998 [JP] Japan .................................. 87100323

[51] Int. Cl.[7] ...................................................... G11C 7/02
[52] U.S. Cl. ......................... 365/210; 365/206; 365/208; 365/194; 365/230.01
[58] Field of Search .................................. 365/222, 210, 365/191, 206, 208, 194, 230.01; 257/679; 327/142; 341/144; 340/825.15

[56] References Cited

U.S. PATENT DOCUMENTS

| | | | |
|---|---|---|---|
| 5,243,344 | 9/1993 | Konlopoulos et al. | 341/143 |
| 5,430,681 | 7/1995 | Sugawara et al. | 365/222 |
| 5,861,767 | 1/1999 | Patel et al. | 327/126 |

Primary Examiner—Viet Q. Nguyen
Attorney, Agent, or Firm—Jacobson, Price, Holman & Stern, PLLC

[57] ABSTRACT

The present invention discloses a digital-to-analog converter (DAC) with noise equalized and a device capable of equalizing noise in SRAM. In the DAC, when the BLANK signal is high, a transient current still flows to ground for equalizing noise. The device capable of equalizing noise in SRAM comprises a dummy read/write memory cell for adding read/write operations and a auto-detection circuit for detecting when to add read/write operations.

4 Claims, 13 Drawing Sheets

NOISE EQUALIZED DAC AND DEVICE CAPABLE OF EQUALIZING NOISE IN SRAM

BACKGROUND OF THE INVENTION

1. Field of the Invention

The present invention relates to a digital-to-analog converter (DAC) and a device related to SRAM, and especially relates to a noise-equalized DAC and a device capable of equalizing noise in SRAM.

2. Description of the Related Art

When mixed signal integrated circuits, comprising analog circuits and digital circuits, are developed, how to process noise is an important subject, especially in highly integrated circuits.

For example, in a mixed signal image processing integrated circuits on a chip or on a application board comprising an ADC, DAC and SRAM, the DAC and SRAM may affect the sampling level of the ADC. This may cause some static screen having a different grade level compared with its neighborhood.

The following statements describe how an ADC is affected by the DAC and the TRAM.

(1) How DAC affects the sampling level of an ADC

When the ADC is sampling image data, if the DAC receives a BLANK signal at this moment, DAC must make the whole screen black. A non-equalization noise burst occurs at the same time of each horizontal line. This non-equalization noise burst affects the sampling level of the ADC through the noise path and causes some static screen having a different grade level compared with its neighborhood.

Now refer to FIG. 1A which shows a DAC timing sequence chart for each horizontal line. During time period C to F, the ADC converts analog signals into digital signals. The DAC works in time period B to D and time period E to G. In time period D to E, the current source of the DAC is forced into a sleep state due to a high voltage state of BLANK signal. At the edge of the high voltage state of BLANK signal, a large transient current, originally occurring in the DAC, does not flow to the GND terminial. This sudden change in transient current causes a non-equalized noise burst.

FIG. 1B shows a structural diagram of a conventional DAC. As shown in FIG. 1B, a DAC comprises a thermal code decoder 10, a plurality of D-tye flip-flops 20, a plurality of preprocessors 30, and a plurality of current sources 40.

FIG. 1C is a circuit diagram of the current source of a DAC of the prior art. Transistor P1 supplies a fixed current. Transistor P2 controls the current source in a sleep state when the BLANK signal is high. Transistors P3 and P4 receive signals DA and DA_BAR through their gates, wherein the signal DA_BAR is an inverted signal of signal DA. When the signal DA is "0," the transistor P4 is ON, and the transistor P3 is OFF. Conversely, when the signal DA is "1," the transistor P4 is OFF, and the transistor P3 is ON. When the BLANK signal arrives, the transistor P2 is turned off and turns off the current source. Therefore, a non-equalization noise burst occurs.

FIG. 2 is a simulation result for the transient current of the DAC. In FIG. 2, I27 represents the current flowing through the transistor P3 of FIG. 1C and the signal OUT is the voltage at terminal out of FIG. 1C. When the BLANK signal is high, the screen becomes black because of the voltage of OUT is 0V and the current signal I27 is turn to 0 mA simultaneously.

Because the DAC randomly converts image data, the non-equalization noise burst occurs randomly. When the image data at edge of the BLANK signal has a darker hue, the non-equalization noise is more intense, and vice versa.

Since a screen consists of hundreds of horizontal lines, some fixed regions of the screen may have a different grade level compared with adjacent area.

When the hue of image data is lighter, the transient current at GND terminal (VSS_DAA in FIG. 1C) is smaller, and a smaller change in transient current occurs in case of a high BLANK signal, and vice versa.

(2) How SRAM affects the sampling level of an ADC

Now refer to FIG. 3A, which is a timing sequence chart of a mixed image processing IC which comprises an ADC and SRAM. In FIG. 3A, signal RE and WE represent a read and write operation of SRAM, respectively. The signals RCLK and WCLK represent read and write clocks, respectively. The signal ADC represents the operation period of the ADC circuit. As shown in FIG. 3A, the ADC circuit converts analog signals into digital signals in time period C to F. However, the SRAM only executes a write operation in time period D to E, and executes both read and write operations in time period C to D and period E to F. Therefore, read/write operations are not uniform in time period D to E. From simulations of transient current, it is known when the read/write operations are not uniform in one period, the transient current becomes smaller and a non-equalization noise burst will occur.

FIG. 3B is a block diagram of applying SRAM for read/write operations of the prior art. In FIG. 3B, RADDR0 and RADDRn represent the LSB (least significant bit) and MSB (most significant bit) of the reading address, respectively. The signal R_RESET and W_RESET are used to reset the read and write counter respectively.

Therefore, there is a need to improve upon the disadvantages of the prior art.

SUMMARY OF THE INVENTION

The present invention discloses a noise-equalized DAC and a device capable of equalizing noise in SRAM.

By applying the present invention, the quality of the image processing IC is improved greatly and there is little additional cost. Therefore, the present invention has much commercial potential.

DESCRIPTION OF THE DRAWINGS

Other objects, features, and advantages of the present invention will become apparent from the following detailed description made with reference to an illustrative but non-limiting embodiment. The description is made with reference to the accompanying drawings, in which.

DESCRIPTION OF THE PREFERRED EMBODIMENT

Embodiment 1: Device capable of equalizing noise in SRAM.

The device capable of equalizing noise in SRAM comprises a dummy memory cell for adding read/write operations and an auto-detection circuit for detecting when the dummy memory cell should add a read/write operation.

The auto-detection circuit consists of logic gates. If the LSR of the read/write address signal does not alter any more, that means the SRAM has stopped-read/write operation. Then, the auto-detection circuit will detect this situation and drive the dummy memory cell to add a dummy read/write operation. Therefore, the read/write operation can be uniform in one period, and the disadvantage of the prior art is overcome.

Figure 4A:
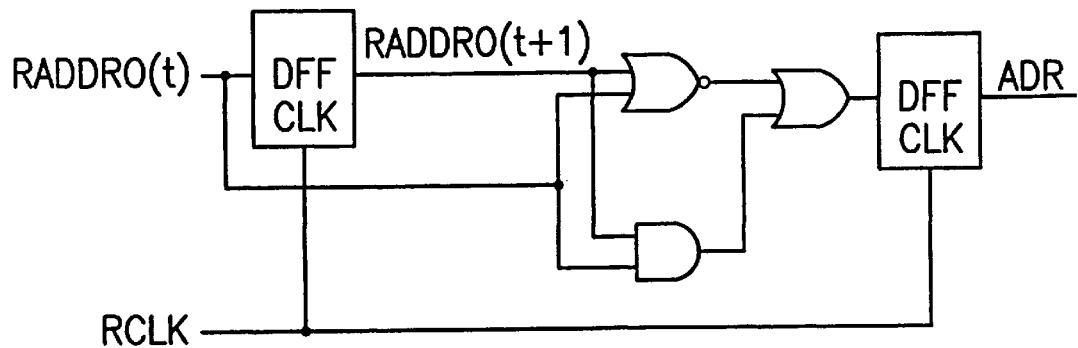
FIGS. 4A and 4B are circuit diagrams of an auto-detection circuit for one example of a device capable of equalizing noise in SRAM of the present invention.

Now refer to FIGS. 4A~4D showing the diagrams of the auto-detection circuit and dummy memory cell of this embodiment. FIG. 4A shows an auto-detection circuit consisting of logic gates. In FIG. 4A, a signal RADDR0(t) is delayed into a signal RADDR0(t+1) through a delay circuit DFF. After a logic XOR is performed on the RADDR0(t) and RADDR0(t+1), one signal is obtained. After a logic AND performed on the RADDR0(t) and RADDR0(t+1), another signal is obtained. Then a logic OR is performed on these two signals, and the result is delayed by another delay circuit DFF. The signal ADR is obtained. When the signal ADR is "1," the dummy read memory adds a dummy read operation to make read/write operations uniform.

Figure 4B:
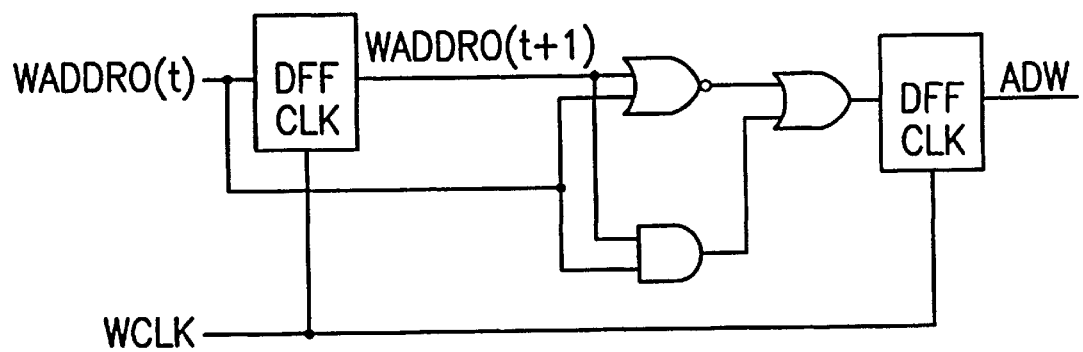

Similarly, in FIG. 4B, the signal ADW is obtained by a similar operation. When the signal ADW is "1," the dummy write memory cell adds a dummy write operation to make read/write operations uniform.

Figure 4C:
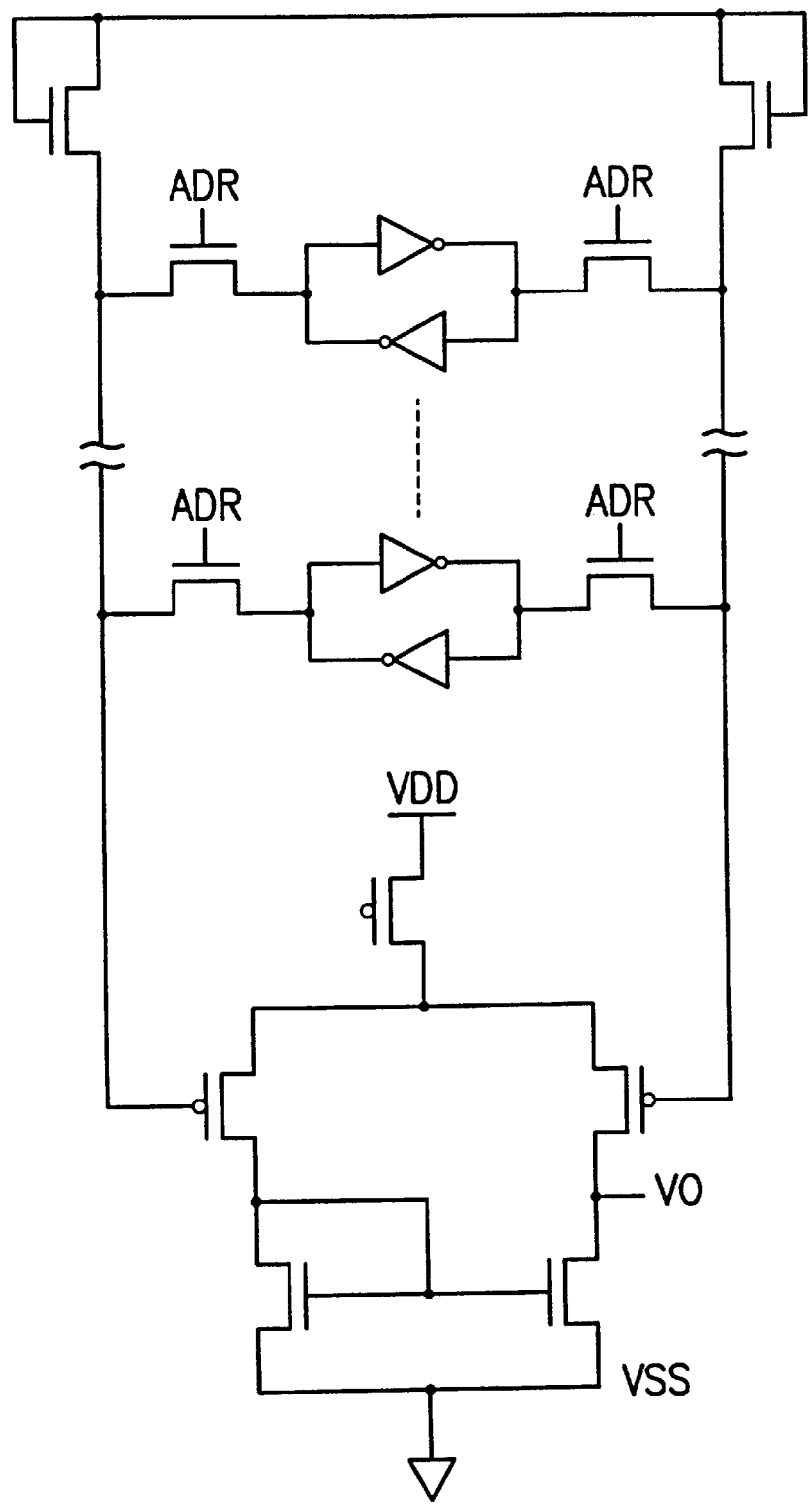
FIGS. 4C, 4D and 4E are structural diagrams of dummy read/write memory cells of the present invention.
Figure 4D:
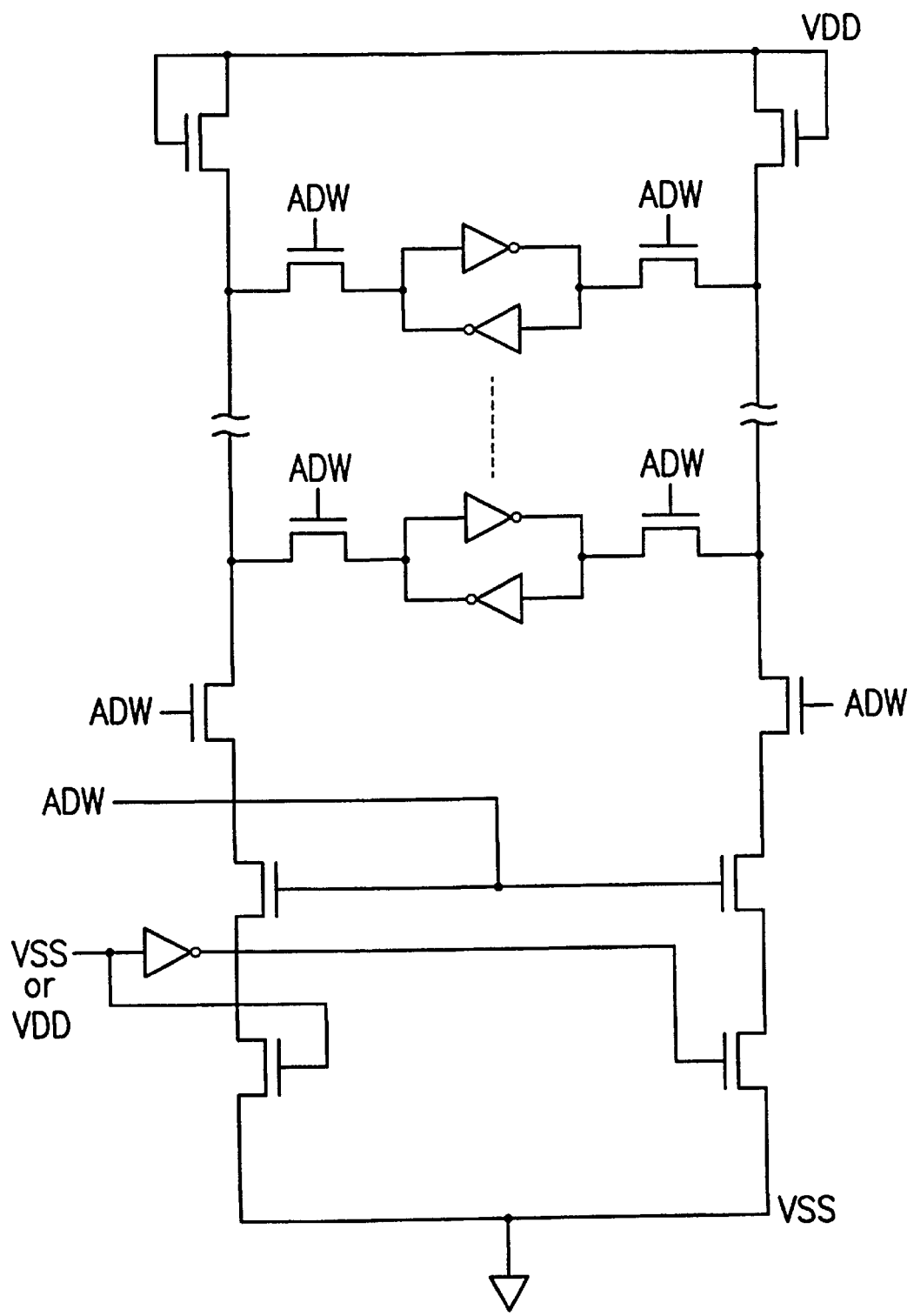

FIGS. 4C and 4D show structures of dummy read and write memory cells, respectively. As shown in FIGS. 4C and 4D, a dummy memory cell primarily consists of n sets of 6 transistors (6T) or 4T cells and other transistors.

Figure 4E:
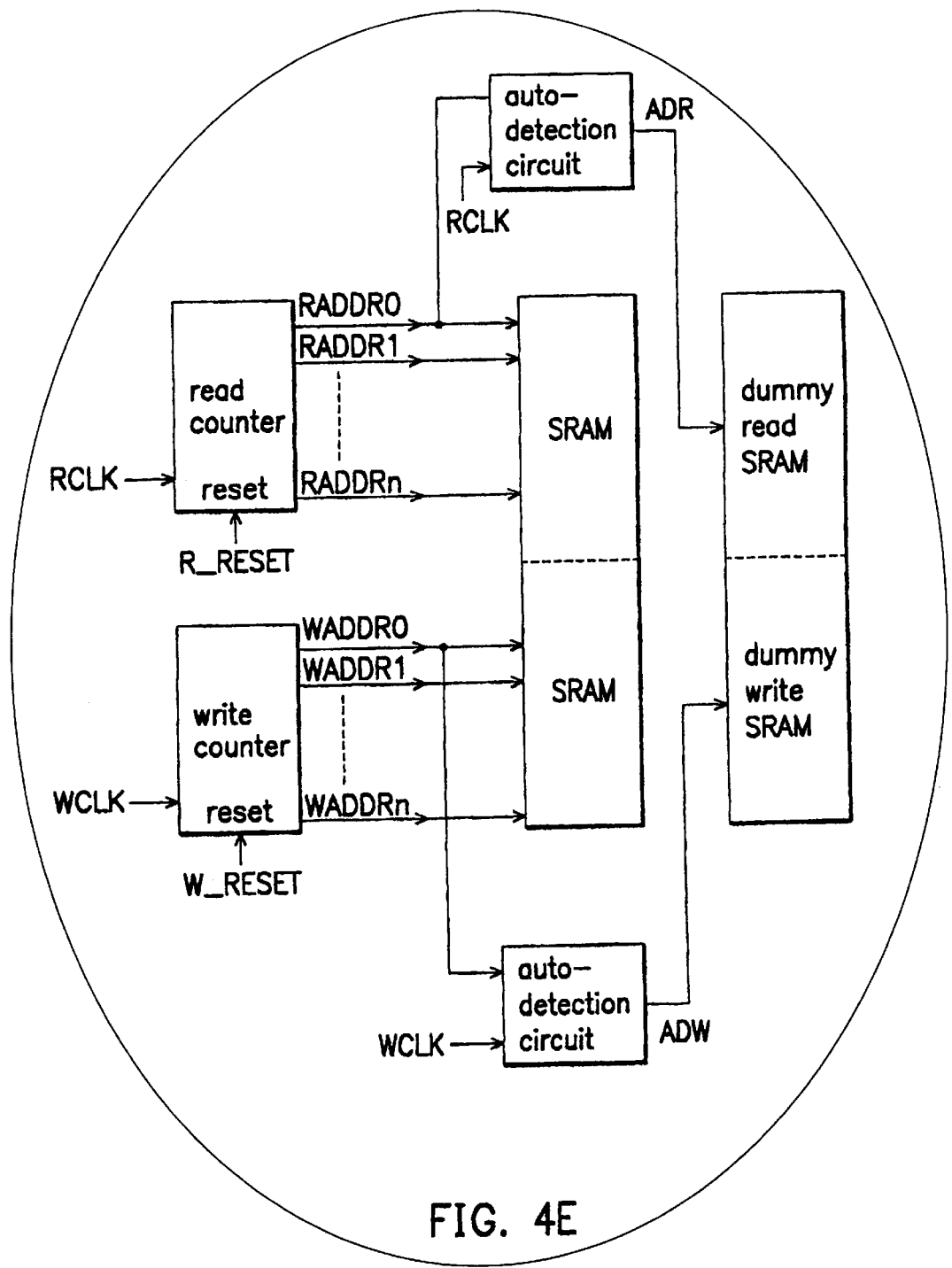

The auto-detection circuit shown in FIGS. 4A, 4B or 4E is designed for random situations. That means at the moment RADDR0(t) or WADDR0(t) does not alter, the auto-detection circuit will detect and drive the dummy memory cell to add a read/write operation.

Figure 5A:
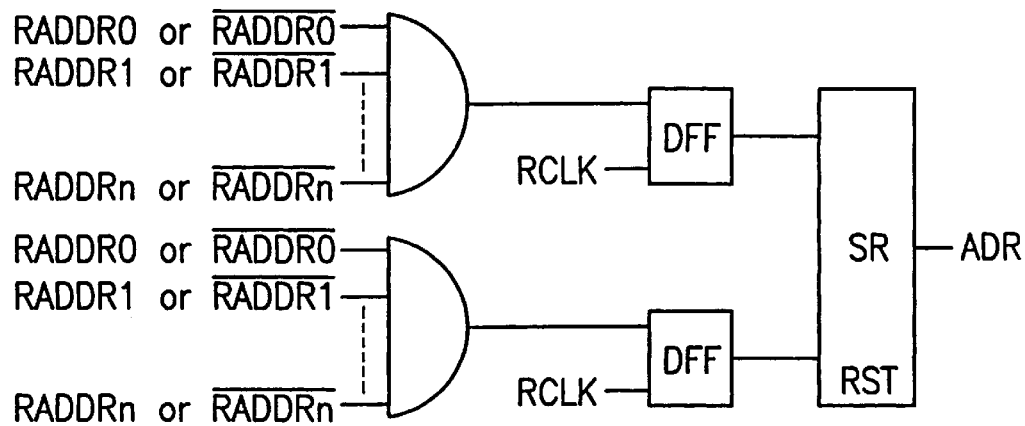
FIGS. 5A and 5B are circuit diagrams of an auto-detection circuit for another example of the present invention.
Figure 5B:
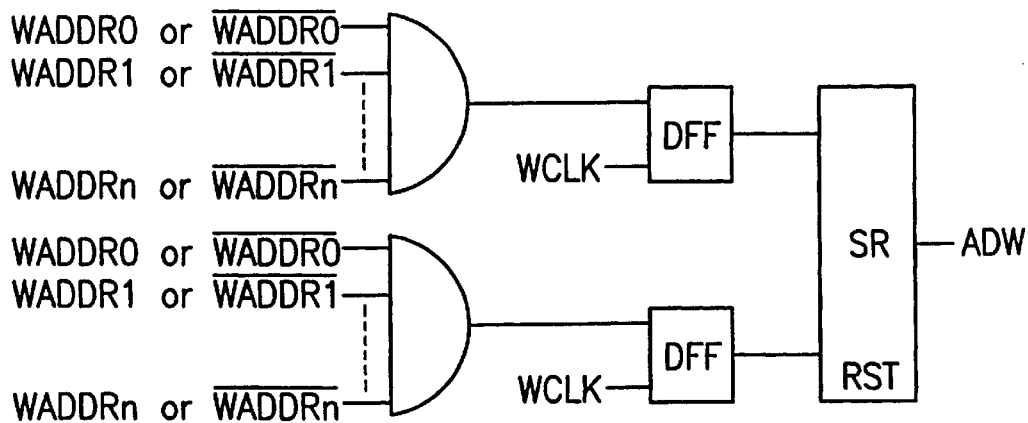

FIGS. 5A and 5B show another type of auto-detection circuit of this embodiment. This type of auto-detection circuit is designed for adding read/write operations by calculation. In FIG. 5A, the signals applied on each input pin of an AND gate may be RADDRm(0≦m≦n) or RADDRm~ (0≦m≦n), wherein the signal RADDRm~ is an inverted signal of the signal RADDRm.

The following statements indicate if it needs to begin for adding a dummy read operation at 200th clocks and to stop the dummy read operation at 300th clocks. That means the signal ADR is high at 200~300clocks, wherein 200 (decimal)=011001000 (binary), 300 (decimal)=100101100 (binary). The bit in binary is RADDRm. When the binary bit is 1, the signal RADDRm is applied to the AND gate, and vice versa. So in this case, RADDR0~; RADDR1~; RADDR2~; RADDR3; RADDR4~; RADDR5~; RADDR6; RADDR7; and RADDR8~ are applied to one AND gate. RADDR0~; RADDR1~; RADDR2; RADDR3; RADDR4~; RADDR5; RADDR6~; RADDR7~; and RADDR8 are applied to the other AND gate. The AND gate in FIG. 5B can be designed similarly for adding write operations.

Figures 6, 7:
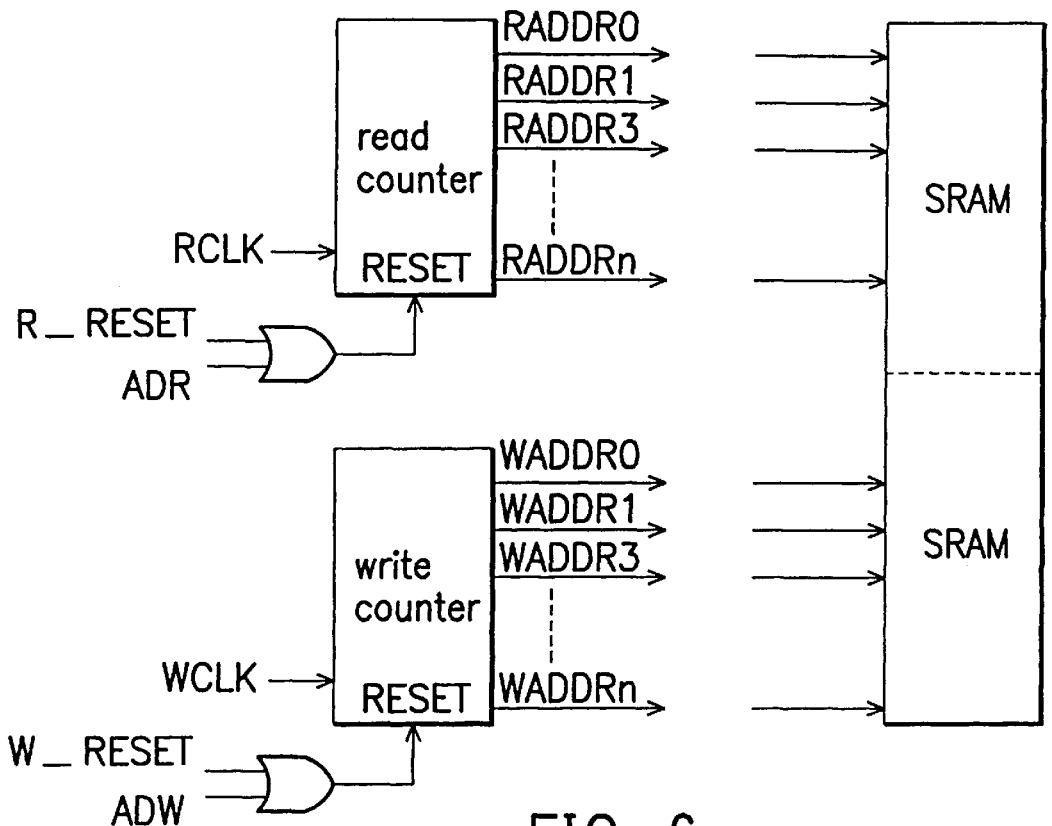
FIG. 6 is a structural diagram of one example of the device capable of equalizing noise of the present invention.
FIG. 7 shows decimal bits in Gray code and results after an XOR logic operation.

In FIG. 6, when the auto-detection circuit detects a need to add read or write operations, the signal ADR/ADW will reset the reading/writing counter. That mns the SRAM reads data from address 0 or write data into address 0. This dummy data is skipped by subsequent circuits.

The auto-detection circuits described above are for processing address signals in binary bits. However, the present invention can be also applied when the address signal is in gray code. Now refer to FIG. 7 which shows an address signal in gray code. In FIG. 7, it is known that two adjacent codes have only one different bit. If one operation, EXOR= A8⊕A7⊕A6⊕A5⊕A4⊕A3⊕A2⊕A1, is performed, the result of EXOR on gray code is 1, 0, 1, 0 . . . . This result is similar to the LSB in binary bit. So the structures of the auto-detection circuit and dummy memory cell are the same as in the random case.

Embodiment 2: DAC with noise equalized

The disadvantages of the prior art rely on a large change in transient current when the signal BLANK is high. In the present invention, the signal BLANK does not depend on the transient current, but is only dependent on the image data DA.

Figure 8A:
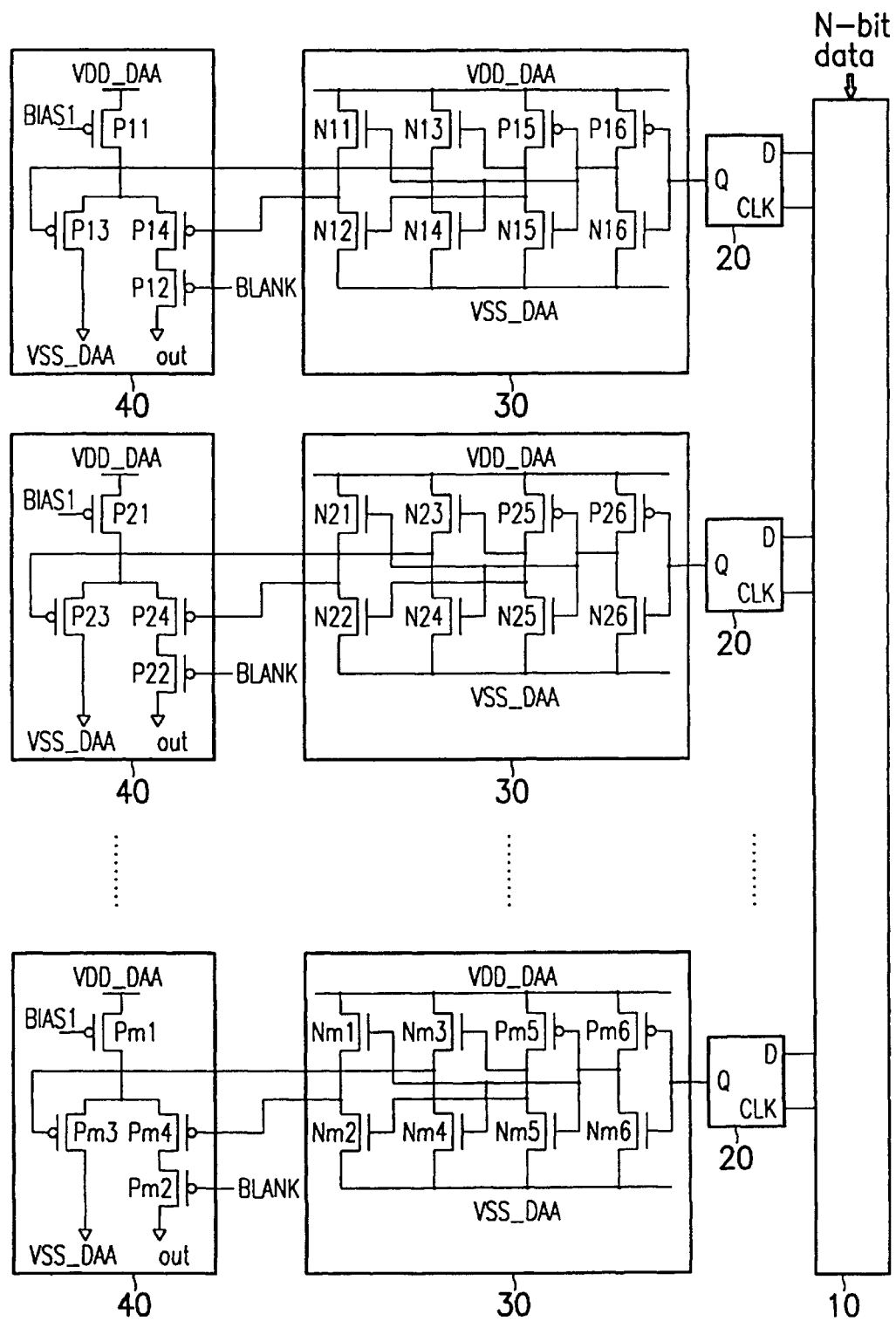
FIGS. 8A~8C are circuit diagrams of three examples of noise-equalized DACs of the present invention.
Figure 8B:
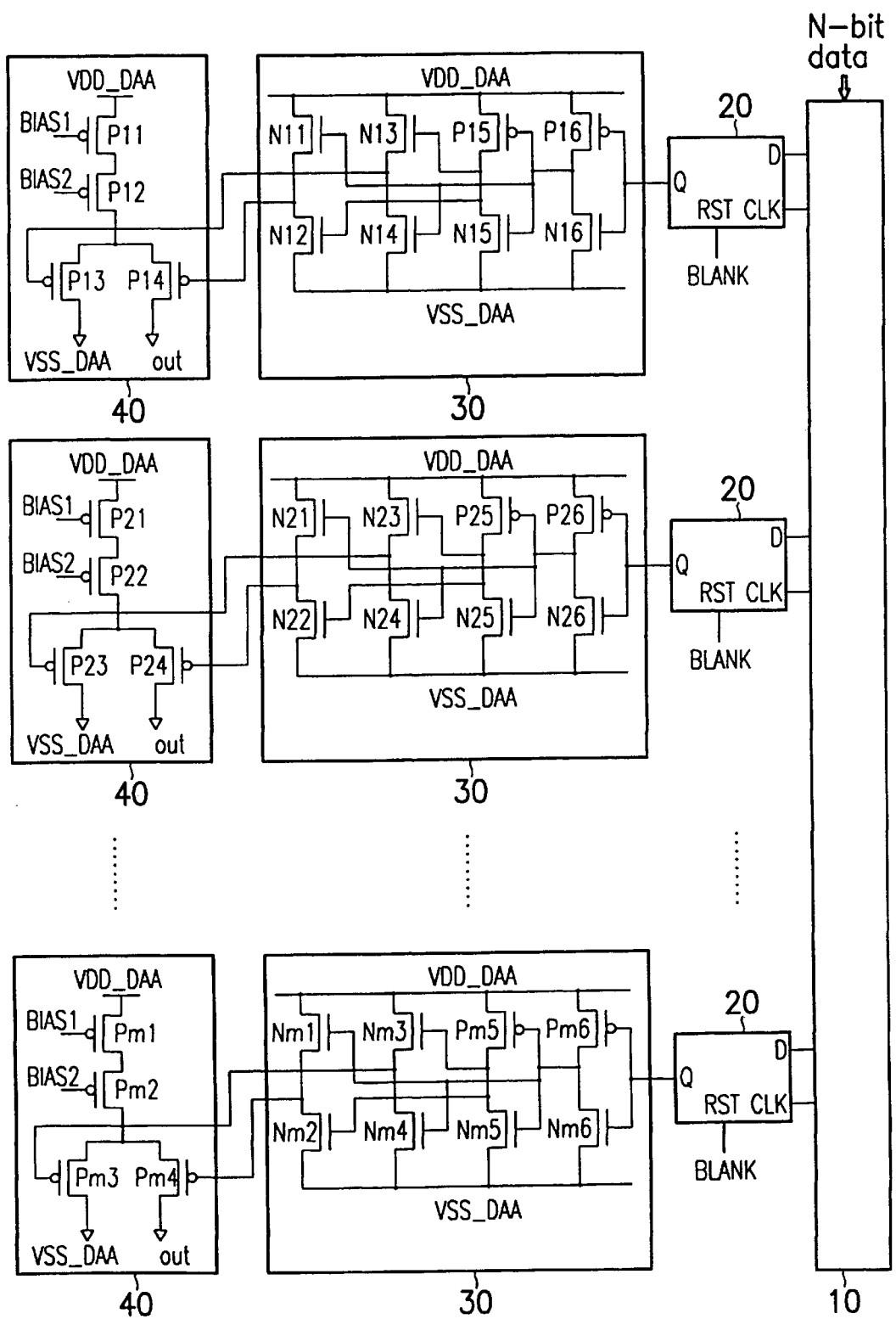
Figure 8C:
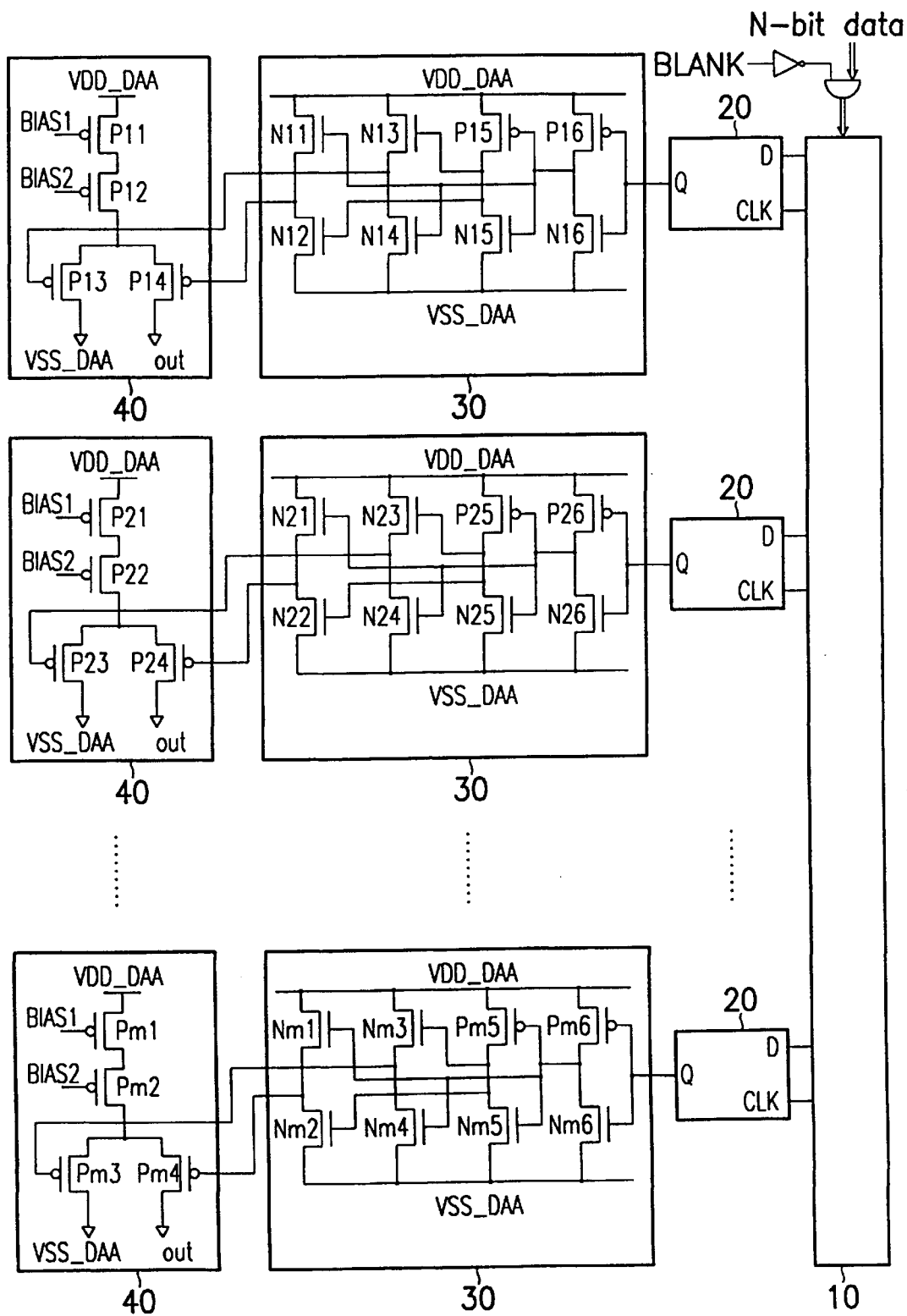

In FIGS. 8A~8C, the reference number 10, 20, 30 and 40 represent the thermal code decoder, D-type flip-flop, preprocessor, and current source, respectively.

Figure 1A:
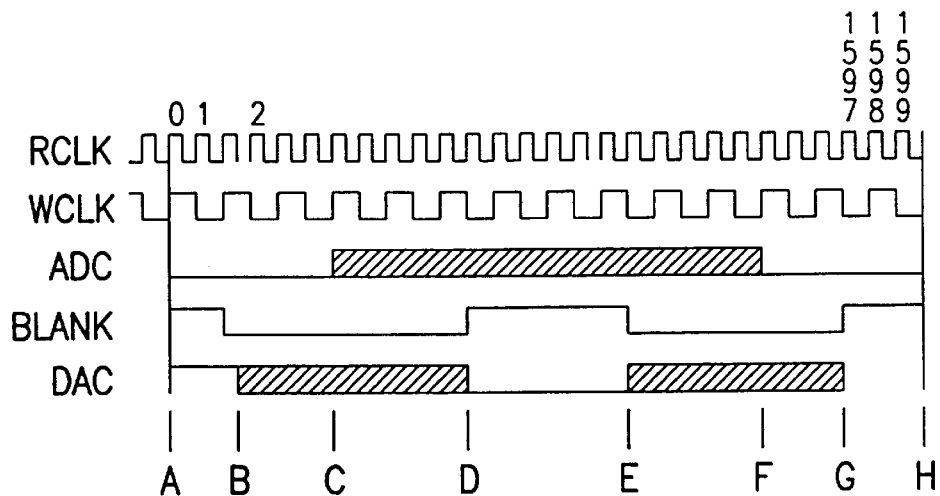
FIG. 1A shows a timing sequence chart of a DAC circuit and an ADC circuit of the prior art.
Figure 1B:
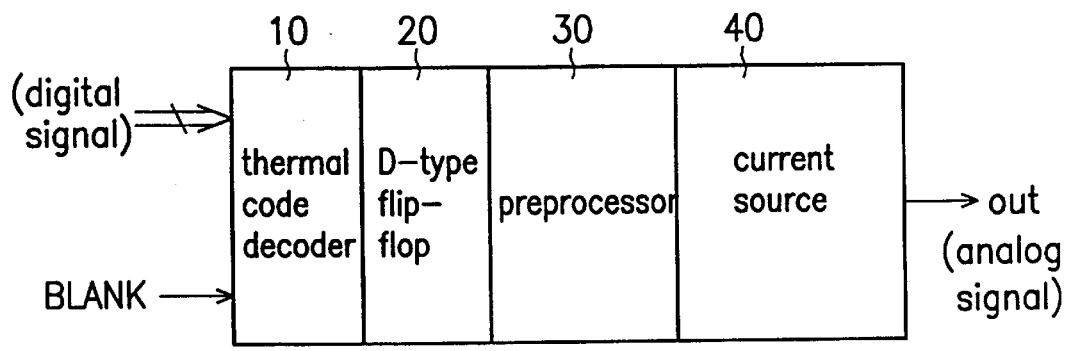
FIG. 1B is a structure diagram of the DAC of the prior art.
Figure 1C:
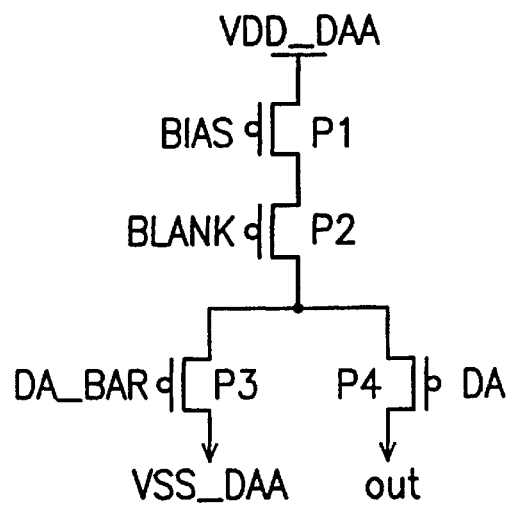
FIG. 1C is a circuit diagram of the current source of the conventional DAC.
Figure 2:
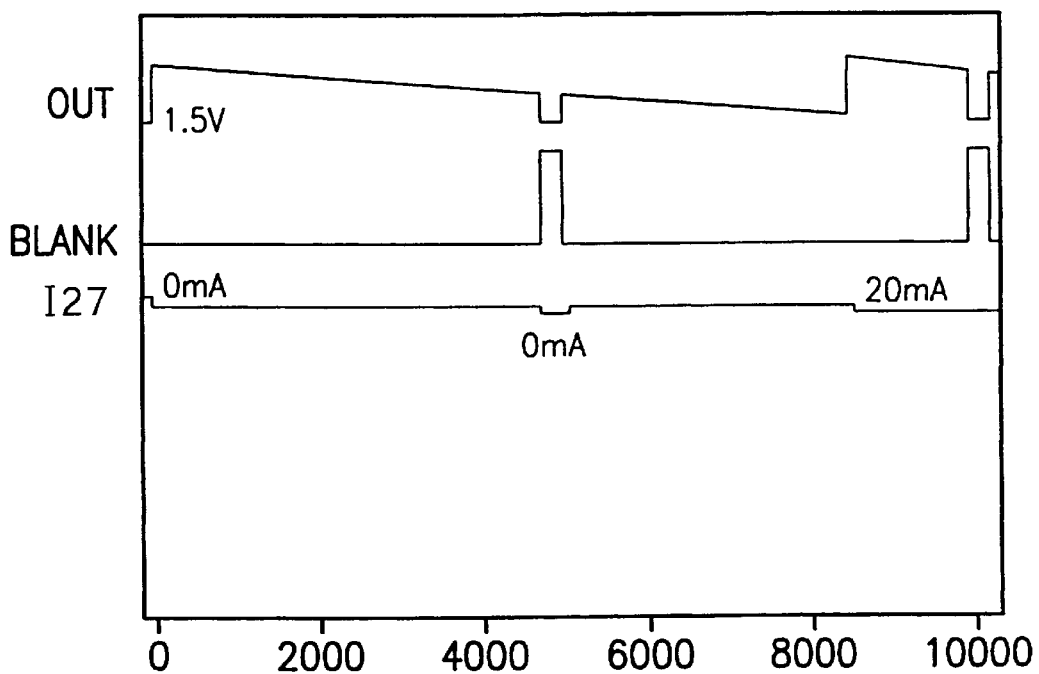
FIG. 2 is a transient simulation of a single-color, 8-bits DAC circuit.
Figure 3A:
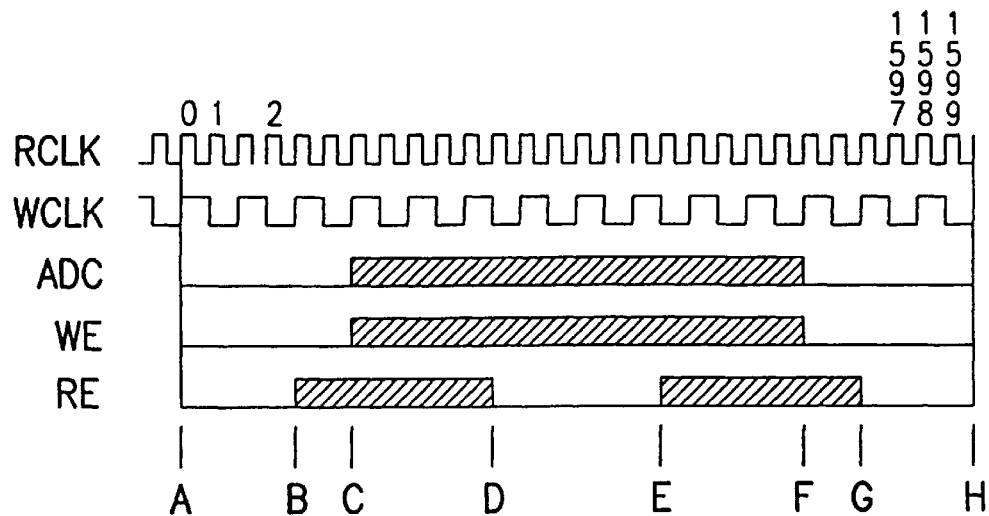
FIG. 3A is a timing sequence chart of the SRAM and ADC of the prior art.
Figure 3B:
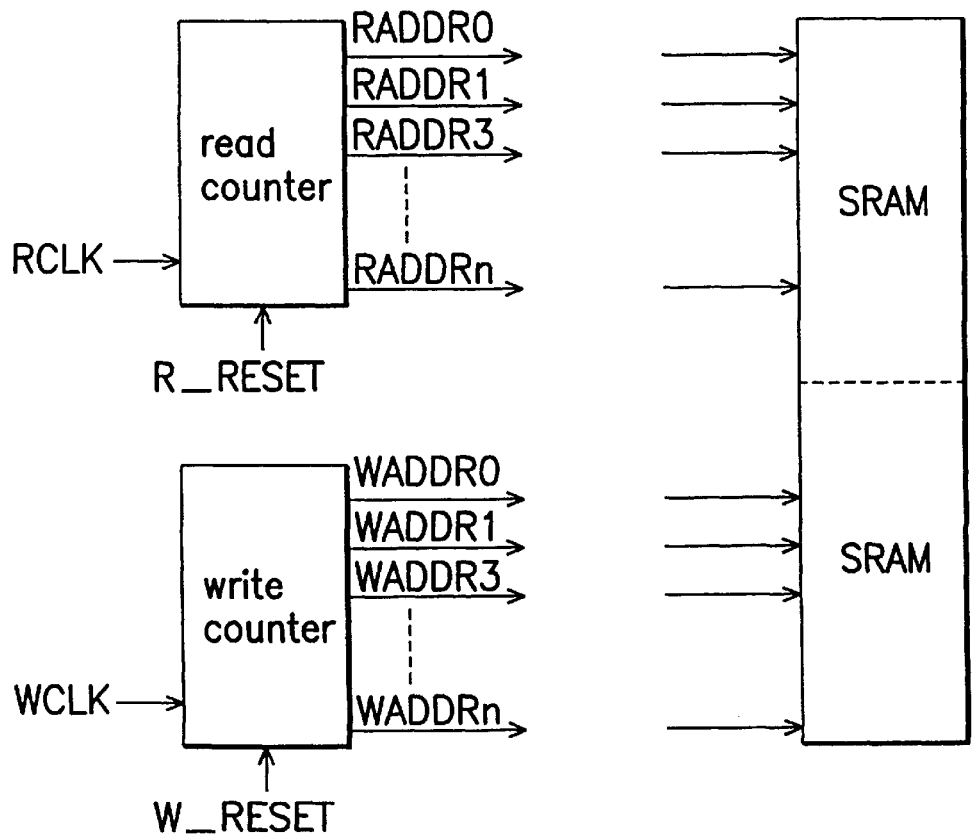
FIG. 3B is a block diagram of applying SRAM for read/write operations of the prior art.

FIG. 8A shows one example of this embodiment. The transistor (P11, P21~Pm1) receives a BIAS signal, the transistor (P12, P22,~Pm2) receives the BLANK signal. The transistors (P13, P23~Pm3) and (P14, P24,~Pm4) receive image data DA and DA~. Comparing FIG. 8A (the present invention) with FIG. 1C (the prior art), it is known that the transistor (P12, P22,~Pm2) is connected serially between the transistor (P14, P24, ~Pm4) and the terminal OUT. Therefore, when the signal BLANK is high to turn off the transistor (P12, P22,~Pm2), the transient current still flows to the ground terminal VSS_DAA.

This embodiment can be still in an other form, as shown in FIGS. 8B and 8C. In FIG. 8B, the signal BLANK is coupled to a RST terminal of a D-type flip-flop. When the signal BLANK is high, the transistors (P13, P23,~Pm3) are turn on and the transistors (P14, P24, ~Pm4) are turn off. The current of GND terminal VSS_DAA I27 flowing through the transistors P13, P23~Pm3 is not 0 when the signal BLANK is high. Therefore, the disadvantages of the prior art are overcome.

Now refer to FIG. 8C. An inverted signal of the signal BLANK is logic AND with each bit of the image data, then the result is coupled to a thermal code decoder 10.

When the signal BLANK is high, the result of the logic AND is 0 regardless of each bit of the image data. This makes outputs of the thermal code decoder 10 all 0, and the outputs Q of all D-type flip-flop 20 all 0. The transistor (P13, P23,~Pm3) is on. Therefore, the current of GND terminal VSS_DAA I27 flowing through the transistors (P13, P23, ~Pm3) is not 0 when the signal BLANK is high. Thus, the disadvantages of the prior drt are overcome.

In the three examples shown in FIGS. 8A~8C, the present invention can still work and the GND noise can be equalized. Image quality can be improved at the same time.

Figure 9:
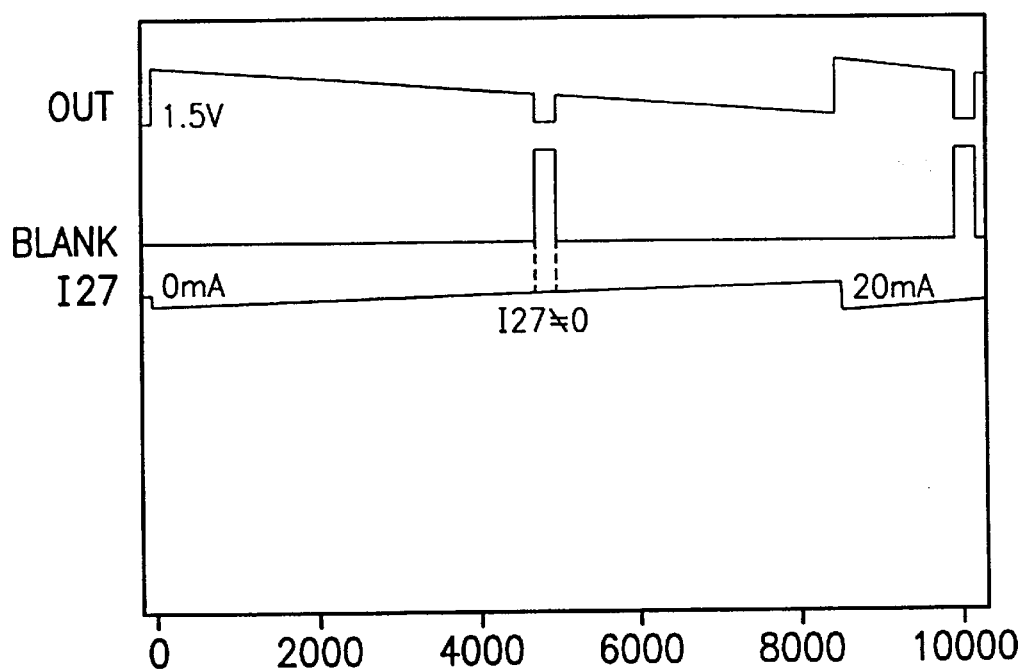
FIG. 9 is a simulation result of the transient current in a DAC circuit of the present invention.

Now refer to FIG. 9 which shows a simulation result of the DAC of the present invention. In FIG. 9, the signal OUT, which is the voltage signal of the terminal OUT, has a value equal to that of the current passing through the transistors (P14, P24, ~Pm4) multiplied by the output resistance (75 ohm). From FIG. 9, it is clear that when the signal BANK is high, the current of GND terminal VSS_DAAI27 passing through the transistor (P13, P23,~Pm3) is not 0.

By applying the present invention, the quality of the image IC is improved greatly and the additional cost is little. Therefore, the present invention has much commercial potential.

Although the invention in connection with preferred embodiments has been described, modifications will now doubtlessly be apparent to those skilled in this technology. The foregoing description of the preferred embodiments of the invention has been provided for the purposes of illustration and description. It is not intended to be exhaustive or to limit the invention to the precise embodiment disclosed herein. The disclosed embodiment has been chosen and described to best explain the principles of the invention and its practical application, thereby enabling others skilled in this technology to understand the invention, to practice various other embodiments thereof and to make various modifications suited to the particular use contemplated of the present invention. As such, it is intended that the scope of this invention shall not be limited to the disclosed, but rather shall be defined by the following claims and their equivalents.

What is claimed is:

1. A device capable of equalizing noise in SRAM memory, comprising:

an auto-detection circuit, with an address signal of said SRAM coupled; and a dummy memory cell, performing corresponding read/write operations in response to the output of said auto-detection circuit.

2. The device of claim 1, wherein said auto-detection circuit comprises:

a first delay circuit, delaying the LSB of said address signal of said SRAM memory;

an XOR gate, receiving said LSB and output of said first delay circuit;

an AND gate, receiving said LSB and output of said first delay circuit;

an OR gate, receiving output of said XOR gate and output of said AND gate; and a second delay circuit, delaying output of said OR gate, and the output of said second delay circuit acting as the output signal of said auto-detection circuit.

3. The device of claim 1, wherein said auto-detection circuit comprises:

a first AND gate, the inputs of which consist of predetermined states of said address signal that cause said dummy memory cell to begin additional operations;

a second AND gate, the inputs of which consist of predetermined states of said address signal that cause said dummy memory cell to stop additional operations;

a first delay circuit, delaying the output of said first AND gate;

a second delay circuit, delaying the output of said second AND gate; and an SR flip-flop, receiving the output of said first delay circuit and the output of said second delay circuit, wherein the output of said SR flip-flop acts as the output signal of said auto-detection circuit.

4. The device of claim 1, wherein when said SRAM memory acts as said dummy memory cell, a reset input pin of a counter is coupled to an OR gate receiving said output of said auto-detection circuit and a reset signal.

* * * * *

UNITED STATES PATENT AND TRADEMARK OFFICE
CERTIFICATE OF CORRECTION

| | |
|---|---|
| PATENT NO. | : 6,147,920 |
| APPLICATION NO. | : 09/081865 |
| DATED | : November 14, 2000 |
| INVENTOR(S) | : Ho |

It is certified that error appears in the above-identified patent and that said Letters Patent is hereby corrected as shown below:

Title Page: Foreign Application Priority Data "Jul. 1, 1998 [JP] Japan 87100323" should be changed to "Jul. 1, 1998 [TW] Taiwan 87100323."

Signed and Sealed this

Tenth Day of February, 2009

JOHN DOLL
*Acting Director of the United States Patent and Trademark Office*